(12) United States Patent
Fried et al.

(10) Patent No.: US 7,087,477 B2
(45) Date of Patent: Aug. 8, 2006

(54) FINFET SRAM CELL USING LOW MOBILITY PLANE FOR CELL STABILITY AND METHOD FOR FORMING

(75) Inventors: David M. Fried, Williston, VT (US); Randy W. Mann, Jericho, VT (US); K. Paul Muller, Wappingers Falls, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/987,532

(22) Filed: Nov. 12, 2004

(65) Prior Publication Data

US 2005/0121676 A1    Jun. 9, 2005

Related U.S. Application Data

(62) Division of application No. 10/011,351, filed on Dec. 4, 2001, now Pat. No. 6,967,351.

(51) Int. Cl.
*H01L 21/8238* (2006.01)

(52) U.S. Cl. ............. 438/199; 257/627; 257/E29.004

(58) Field of Classification Search ............. 438/982, 438/154, 197–199; 257/627, 255, 527
See application file for complete search history.

(56) References Cited

U.S. PATENT DOCUMENTS

| | | | | |
|---|---|---|---|---|
| 3,603,848 A | | 9/1971 | Sato et al. ............. 257/255 |
| 4,933,298 A | * | 6/1990 | Hasegawa ............. 438/150 |
| 5,198,683 A | * | 3/1993 | Sivan ............. 257/67 |
| 5,698,893 A | * | 12/1997 | Perera et al. ............. 257/627 |
| 5,705,414 A | * | 1/1998 | Lustig ............. 438/585 |
| 5,945,690 A | | 8/1999 | Saito et al. ............. 257/94 |
| 5,953,606 A | * | 9/1999 | Huang et al. ............. 438/241 |
| 5,960,271 A | | 9/1999 | Wollesen et al. ............. 438/197 |
| 5,970,330 A | | 10/1999 | Buynoski ............. 438/198 |
| 6,100,128 A | * | 8/2000 | Wang et al. ............. 438/238 |
| 6,180,517 B1 | * | 1/2001 | Liou et al. ............. 438/639 |
| 6,190,949 B1 | | 2/2001 | Noguchi et al. ............. 438/149 |
| 6,194,273 B1 | | 2/2001 | Matsuura et al. ............. 438/270 |

* cited by examiner

*Primary Examiner*—Eugene Lee
*Assistant Examiner*—William Kraig
(74) *Attorney, Agent, or Firm*—Schmeiser, Olsen & Watts; William D. Sabo

(57) ABSTRACT

The present invention provides a device design and method for forming the same that results in Fin Field Effect Transistors having different gains without negatively impacting device density. The present invention forms relatively low gain FinFET transistors in a low carrier mobility plane and relatively high gain FinFET transistors in a high carrier mobility plane. Thus formed, the FinFETs formed in the high mobility plane have a relatively higher gain than the FinFETs formed in the low mobility plane. The embodiments are of particular application to the design and fabrication of a Static Random Access Memory (SRAM) cell. In this application, the bodies of the n-type FinFETs used as transfer devices are formed along the {110} plane. The bodies of the n-type FinFETs and p-type FinFETs used as the storage latch are formed along the {100}. Thus formed, the transfer devices will have a gain approximately half that of the n-type storage latch devices, facilitating proper SRAM operation.

18 Claims, 14 Drawing Sheets

FINFET SRAM CELL USING LOW MOBILITY PLANE FOR CELL STABILITY AND METHOD FOR FORMING

This application is a divisional of Ser. No. 10/011,351; filed on Dec. 4, 2001 now U.S. Pat. No. 6,967,351.

BACKGROUND OF THE INVENTION

1. Technical Field

The present invention relates generally to the field of semiconductor manufacturing and, more specifically, to a method for Fin field effect transistors having different gains.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) Unfortunately, increased device density in CMOS FET often results in degradation of performance and/or reliability.

One type of FET that has been proposed to facilitate increased device performance is the Fin field effect transistor, often referred to as a FinFET. In a FinFET a vertical "fin" shaped structure is defined to form the body of the transistor. Gates are then formed on one or both sides of the fin. When gates are formed on both sides of the fin, the transistor is generally referred to as a double gate FinFET.

Unfortunately, several difficulties arise in the design and fabrication of FinFET transistors. For example, there has been no efficient method for creating FinFETs having different gains on the same device. Previous methods used to form multiple FinFETs have resulted in excessive device size and thus a decrease in device density. For example, one technique used to make different devices with different gains has been to change the relative dimensions of the devices. For example, the width of devices has been increased to increase the strength of a particular device. As an other example, multiple Fins have been used in one FinFET to increase the strength of the device. Unfortunately, both these techniques increase the size of the strengthened FinFET device and thus negatively effect the device density that can be achieved.

These difficulties arise in the design of specialized circuits in FET technologies. In an SRAM cell, there are typically six transistors. Two NFETs and two PFETs form the storage cell. Two more NFETs are used as pass-gate transistors to control the connection between the storage cell and the bit-lines. For cell stability, these two pass-gate NFETs must drive less current than the NFETs in the storage cell. There are two commonly known methods for varying drive strength in FETs. First, the device width can be increased to provide a "stronger" device. This would result in a significantly larger SRAM cell. The second method would be to increase the channel length to provide a "weaker" device. This would also negatively impact the cell density.

Thus, there is a need for improved device structures and methods of fabrications of FinFETs that provide for making different devices with different gain levels without overly impacting device density.

DISCLOSURE OF INVENTION

Accordingly, the present invention provides a device design and method for forming the same that results in Fin Field Effect Transistors having different gains without negatively impacting device density. The present invention forms relatively low gain FinFET transistors in a low carrier mobility plane and relatively high gain FinFET transistors in a high carrier mobility plane. Thus formed, the FinFETs formed in the high mobility plane have a relatively higher gain than the FinFETs formed in the low mobility plane.

For example, the body of selected n-type FinFETs can be formed in a {110} plane while the body of other selected n-type FinFET is formed in a {100} crystal plane. The mobility of electrons (the dominate carrier of n-type devices) in the {110} plane is approximately half that of the mobility of electrons in the {100} plane. Thus, the n-type FinFETs formed with their body in a {110} plane will have approximately half the gain of the n-type FinFETs formed with their body in a {100} plane.

The embodiments of the present invention are applicable to any device in which transistors with different gains are desirable. These include a wide variety of logic circuits such as latches. In one particular application, the present invention is applied to the design and fabrication of a Static Random Access Memory (SRAM) cell. In this application, the bodies of the n-type FinFETs used as transfer devices are formed along the {110} plane. The bodies of the n-type FinFETs and p-type FinFETs used as the storage latch are formed along the {100}. Thus formed, the transfer devices will have a gain approximately half that of the n-type storage latch devices, facilitating proper SRAM operation The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Figure 1:
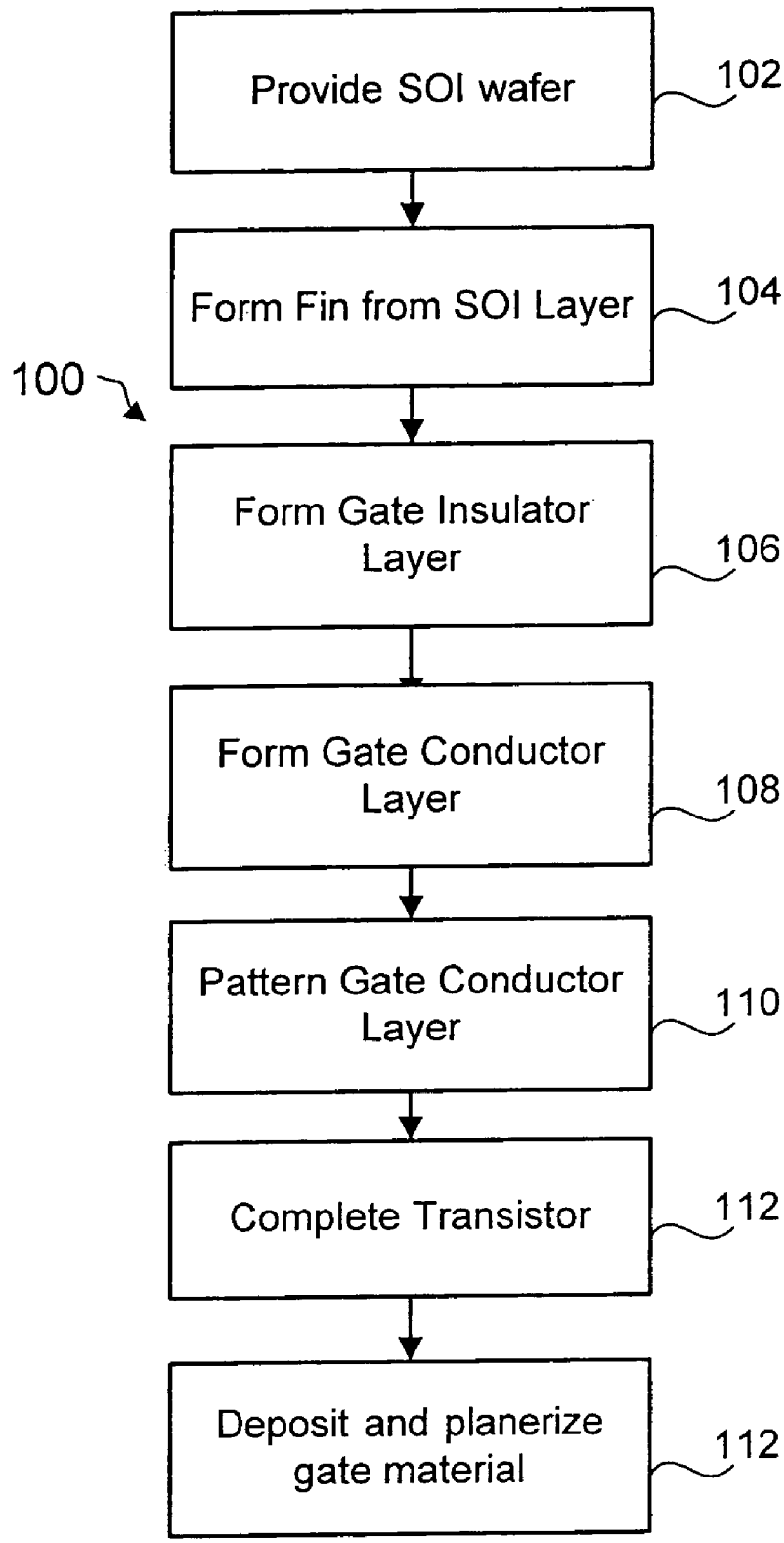
FIG. 1 is a flow diagram illustrating a fabrication method of the invention.

As discussed above, the present invention exploits semiconductor physics by utilizing different crystal planes for FinFET transistors that results in FinFET having different gains without overly impacting negative device density. The present invention forms relatively low gain FinFET transistors in a low carrier mobility plane and relatively high gain FinFET transistors in a high carrier mobility plane. Thus formed, the FinFETs formed in the high mobility plane have a relatively higher gain than the FinFETs formed in the low mobility plane. Individuals skilled in the art of semiconductor physics may wish to proceed with to the Detailed Description section of this specification. However, those individuals who are new to crystal lattice planes and directions, should read the following Overview section in order to best understand the benefits and advantages of the present invention.

1. Overview

In crystalline solids, the atoms which make up the solid are spatially arranged in a periodic fashion called a lattice. The crystal lattice always contains a volume which is representative of the entire lattice and it is regularly repeated throughout the crystal. The directions in a lattice are expressed as a set of three integers with the same relationship as the components of a vector in that direction. The three vector components are given in multiples of the basic vectors. For example, in cubic lattices, such as silicon that has a diamond crystal lattice, a body diagonal exists along the [111] direction with the [ ] brackets denoting a specific direction.

However, many directions in a crystal are equivalent by a symmetry transformation, depending on the arbitrary choice of orientation of the axes. For example, crystal directions in the cubic lattice [100], [010], and [001] are all crystallographically equivalent. In this application, a direction and all of its equivalent directions are denoted by < > brackets. Thus, the designation of directions <100> includes the equivalent [100], [010], and [001] directions. Since these directions will also be on the negative side of the origin (as arbitrarily defined), unless specifically stated or shown in this description and the following detailed description, a crystal direction includes both positive and negative integers. Accordingly, for example, the designation of the directions <100> includes the [-100], [0–10], and [00–1] planes in addition to the [100], [010], and [001] direction Planes in a crystal also may be determined with a set of three integers. They are used to define a set of parallel planes and each set of three integers in ( ) parentheses identify a specific plane. A plane identified by a specific set of three integers is perpendicular to a direction identified by the identical three integers. For example, the proper designation for a plane perpendicular to the [100] direction is (100). Thus, if either a direction or a plane of a cubic lattice is known, its perpendicular counterpart may be quickly determined without calculation.

As in the case of directions, many planes in a lattice are equivalent by a symmetry transformation. For example, the (100), (010), and (001) planes are planes of equivalent symmetry. In this application, a plane and all of its equivalent planes are denoted by { } parentheses. Thus, the designation of planes {100} includes the equivalent (100), (010), and (001) planes. Like the crystal direction, the crystal plane in this description and the following detailed description includes both positive and negative integers unless specifically stated or shown otherwise. Accordingly, for example, the designation of the planes {100} includes the (-100), (0–10), and (00–1) planes in addition to the (100), (010), and (001) planes.

Detailed Description

The present invention may be readily adapted to a variety of methods of fabricating complimentary metal oxide semiconductor (CMOS) fin field effect transistors (FinFETs) on the same substrate utilizing different crystal planes for FET current channels in order to optimize mobility for both carrier types and/or reduce mobility in specific devices as needed, thereby maintaining an acceptable and/or desired performance. It will be understood by one of ordinary skill in the art that the invention is not limited to the specific structures illustrated in the drawings or to the specific steps detailed herein. It will also be understood that the invention is not limited to use of any specific dopant types provided that the dopant types selected for the various components are consistent with the intended electrical operation of the device.

The present invention provides a device design and method for forming the same that results in Fin Field Effect Transistors having different gains without overly impacting device density. The present invention forms relatively low gain FinFET transistors in a low carrier mobility plane and relatively high gain FinFET transistors in a high carrier mobility plane. Thus formed, the FinFETs formed in the high mobility plane have a relatively higher gain than the FinFETs formed in the low mobility plane.

For example, the body of selected n-type FinFETs can be formed in a {110} plane while the body of other selected n-type FinFET is formed in a {100} crystal plane. The mobility of electrons (the dominate carrier of n-type devices) in the {110} plane is approximately half that of the mobility of electrons in the {100} plane. Thus, the n-type FinFETs formed with their body in a {110} plane will have approximately half the gain of the n-type FinFETs formed with their body in a {100} plane.

The embodiments of the present invention are applicable to any device in which transistors with different gains are desirable. These include a wide variety of logic circuits such as latches. In one particular application, the present invention is applied to the design and fabrication of a Static Random Access Memory (SRAM) cell. In this application, the bodies of the n-type FinFETs used as transfer devices are formed along the {110} plane. The bodies of the n-type FinFETs and p-type FinFETs used as the storage latch are formed along the {100}. Thus formed, the transfer devices will have a gain approximately half that of the n-type storage latch devices, facilitating proper SRAM operation.

Turning now to FIG. 1, exemplary method 100 for forming CMOS FinFETs in accordance with the present invention is illustrated. Generally, fabrication method 100 of present invention may form CMOS FinFETs by: providing a substrate having a surface oriented on a first crystal plane; forming a first transistor so that a sidewall of a first fin body forms a first current channel and so that the sidewall of the first fin body is oriented on a second crystal plane to provide a first carrier mobility; and forming a second transistor so that a sidewall of a second fin body forms a second current channel and so that the sidewall of the second fin body is oriented on a third crystal plane to provide a second carrier mobility.

Particularly, first step 102 of method 100 is to provide an appropriate substrate having a surface oriented on a first crystal plane that allows different surface planes for FET current channels to be utilized, such as a {100} crystal plane for example. The proper alignment of the crystal lattice has a large effect on the material properties of the substrate, including its electrical properties (e.g. its carrier mobility properties) and how it reacts to other materials and chemical processing. As will be made clear, providing a substrate having its major surface oriented on a {100} crystal plane for example enables method 100 to form n-type FinFETs with sidewalls of the fin bodies along both the {110} and {100} plane. Because n-type FinFETs can be formed along both these planes, n-type FinFETs with different gains can be easily formed without requiring excessive device size.

Figure 2A:
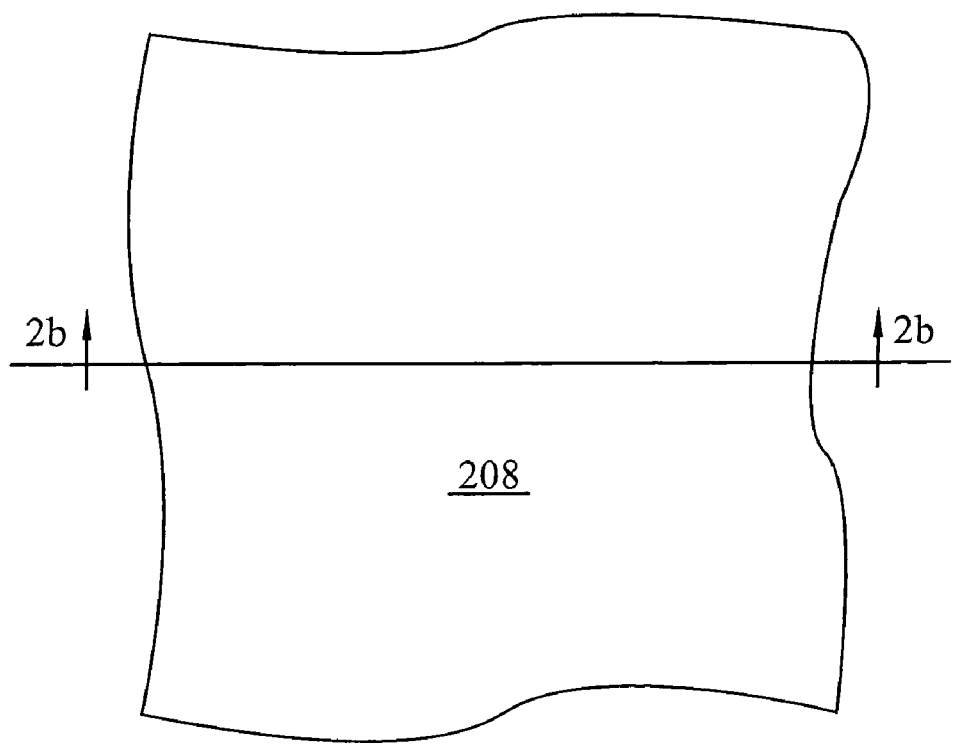
FIGS. 2a, 3a, 4a, 5a, 6a, and 7a are top plan views of an embodiment of a semiconductor structure of the invention during the fabrication method of FIG. 1.
Figure 2B:
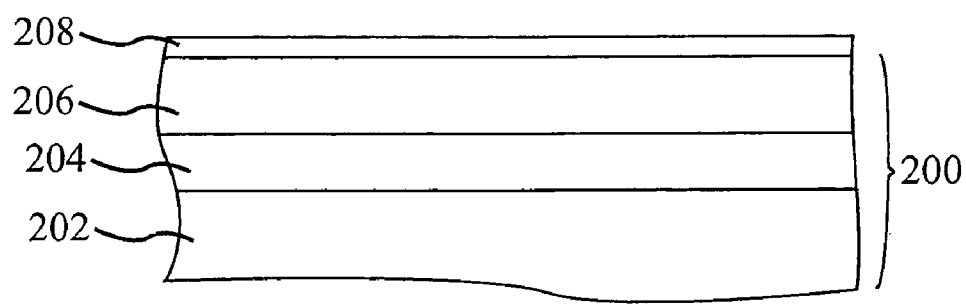
FIGS. 2b, 3b, 4b, 5b, 6b, and 7b are cross-sectional side views of an embodiment of a semiconductor structure of the invention during the fabrication method of FIG. 1 taken along lines 2b—2b, 3b—3b, 4b—4b, 5b—5b, 6b—6b, and 7b—7b of FIGS. 2a, 3a, 4a, 5a, 6a, and 7a respectively.

Referring to the substrate embodiment depicted in FIGS. 2a–2b, substrate 200 may comprise wafer 202 that underlies buried insulator 204 that underlies semiconductor layer 206. Therefore, for example, substrate 200 may comprise a single crystal silicon-on-insulator (SOI) wafer. However, other substrate 200 embodiments may be used, such as a non-SOI wafer comprising only wafer 202 (i.e., a chip) for example. When a non-SOI wafer embodiment is used, the processing remains otherwise identical to that of a SOI wafer embodiment, except as noted.

Still referring to FIGS. 2a–2b, while wafer 202 is depicted as having a minimum of complexity, other wafers of varying complexity may be advantageously employed. Wafer 202 may be composed of any appropriate semiconducting material, including, but not limited to: Si, Ge, GaP, InAs, InP, SiGe, GaAs, or other III/V compounds. For the exemplary purposes of this disclosure, wafer 202 may comprise single crystal silicon and have a surface oriented on a {110} crystal plane.

Buried insulator 204 may be formed on wafer 202 using thermal oxidation, such as rapid-thermal processing (RTP) or furnace processing for example, or other techniques known in the art. Buried insulator 204 may comprise any insulative material, such as Buried Oxide (BOX). However, any type and/or combination of buried insulators may be used for buried insulator 204.

Semiconductor layer 206 may be formed on buried insulator 204 by any technique known in the art, and may comprise any conductive material. For the exemplary purposes of this disclosure, semiconductor layer 206 comprises a single crystal silicon-on-insulator (SOI) layer having a surface oriented on a {100} crystal plane. Semiconductor layer 206 may have any thickness. For the exemplary purposes of this disclosure, semiconductor layer 206 may have a thickness between approximately 50 nm–160 nm. As will be made clear, semiconductor layer 206 thickness may define the thickness (i.e., height) of the fins.

Turning now to FIGS. 2a–4b, step 104 of method 100 is to form one or more fins from semiconductor layer 206. As will be made clear, a portion of each fin (i.e., a fin body) acts as a transistor body. Any number of fins (and therefore FinFETs) may be formed on a substrate, and the fins may be formed in any of the previously proposed techniques. Accordingly, for the exemplary purposes of this disclosure, fins may be formed from semiconductor layer 206 in step 104 in the following manner.

The first step is to deposit hard mask film 208 as depicted in FIGS. 2a–2b. Hard mask film 208 acts as an etch stop layer and will be used throughout the CMOS FinFET fabrication process when needed. For the exemplary purposes of this disclosure, hard mask film 208 may be silicon dioxide ($SiO_2$) or silicon nitride ($Si_3N_4$).

A next step is implemented to pattern and etch hard mask film 208 by any technique known in the art. For example, a suitable thin layer of photoresist (PR) may be used to cover the surface of hard mask film 208. Next, a mask with a predetermined orientation may be used to generate a specific pattern of narrow lines on the PR overlying hard mask film 208. As will be made clear, the particular FinFET plane (the crystal plane that the electrons or holes are associated with) is defined by how the mask is oriented to facilitate etching that fin into substrate 200, as opposed to the particular crystal plane substrate 200 surface is oriented on. Thus, for the first time, implementing simple and predetermined mask changes according to the present invention provides flexibility within substrate 200 to designate particular crystal planes for different devices in order to optimize carrier mobility for both carrier types and/or to reduce mobility in specific devices, if needed.

Figure 3A:
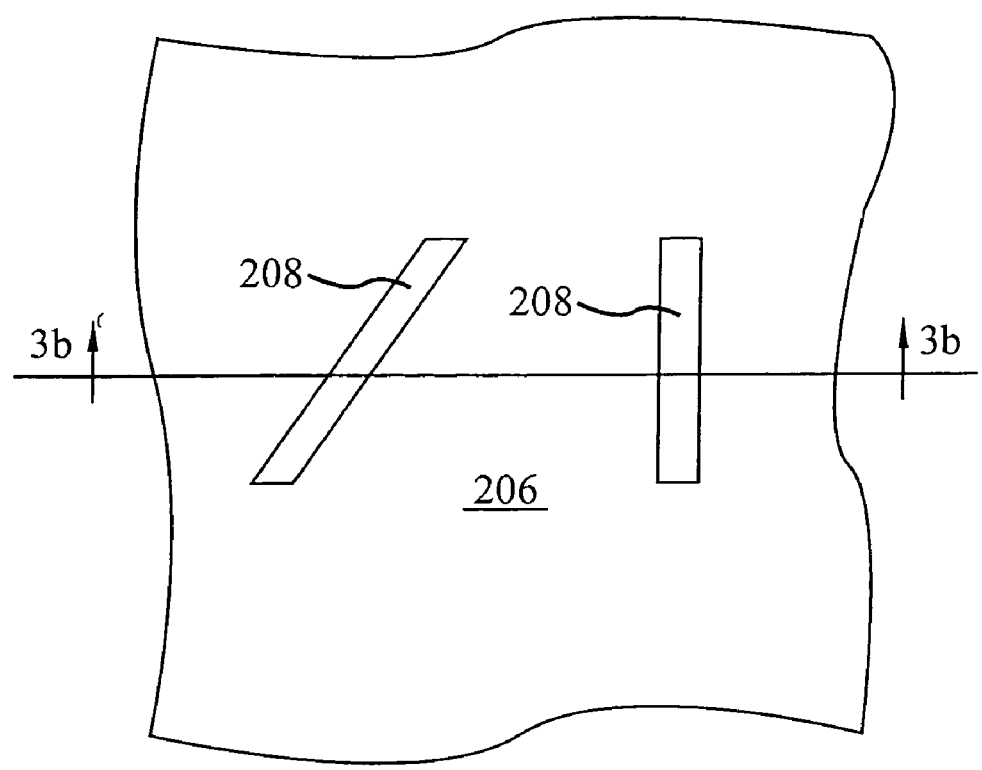
Figure 3B:
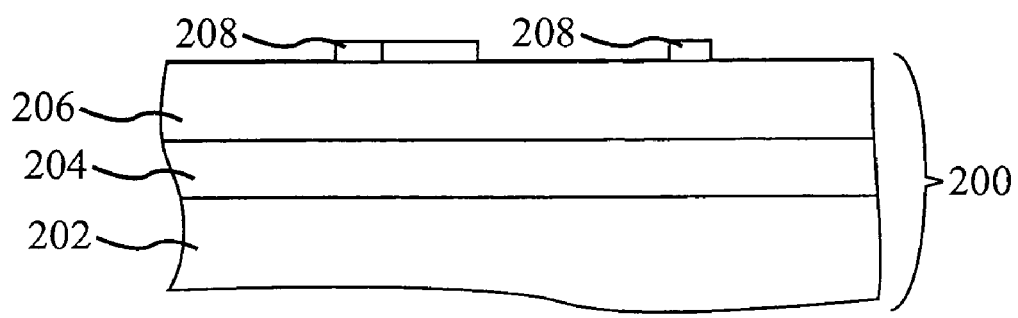

Once the narrow lines on the PR overlying hard mask film 208 are generated, then a suitable directional etch may be performed through hard mask film 208 to form narrow lines in hard mask film 208, which typically have a width in the range of approximately 0.3 nm to 40 nm. As will be made clear, the width of hard mask film 208 narrow lines translates into the width of the fins. The PR is then stripped away by a suitable chemical process, thereby resulting in hard mask film 208 narrow lines on semiconductor layer 206 as depicted in FIGS. 3a–3b.

Figure 4A:
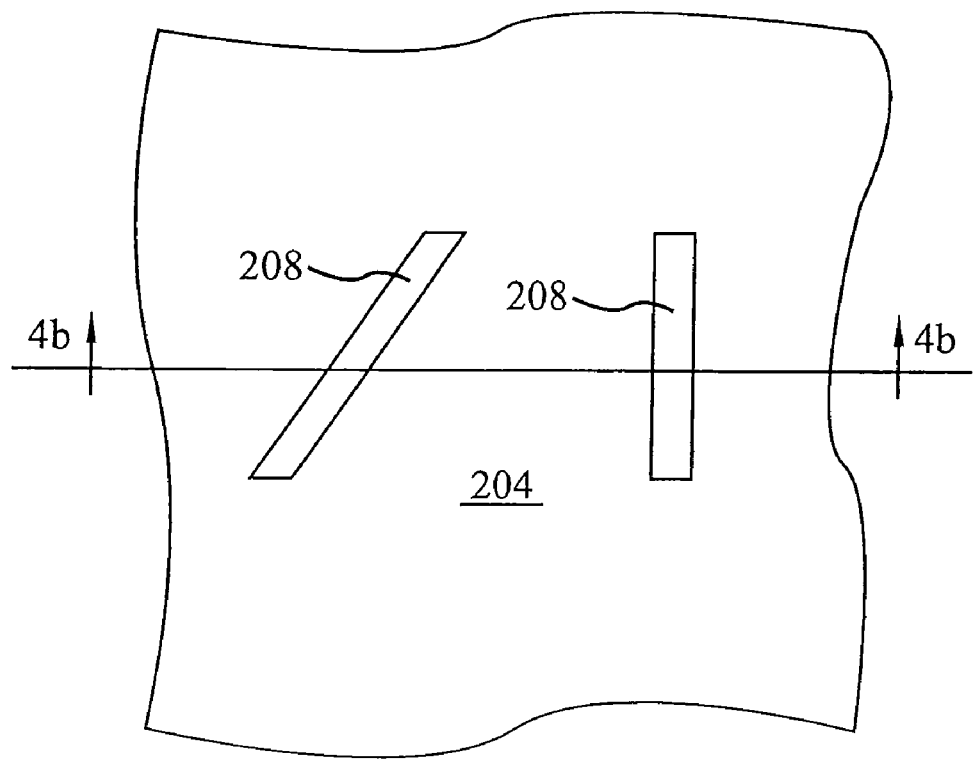
Figure 4B:
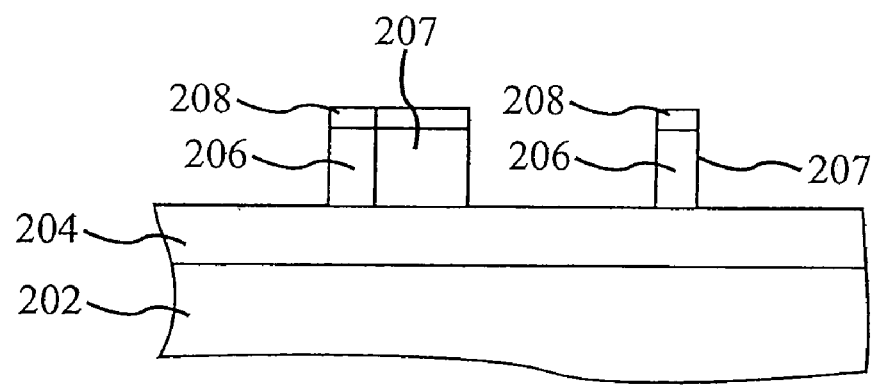

The next step is to anisotropically etch semiconductor layer 206 using hard mask film 208 narrow lines, thereby forming the fins. This may be done using a suitable reactive ion etch (RIE) process that etches semiconductor layer 206, stopping on buried insulator 204. Thus, as depicted in FIGS. 4a–4b, fins remain and comprise portions of semiconductor layer 206 with overlying hard mask film 208 narrow lines. The fins may have opposing vertical sidewalls 207 that are substantially perpendicular to buried insulator 204. The predetermined orientation of the mask in a previous step has resulted in sidewalls 207 being oriented on particular crystal planes in order to optimize carrier mobility for both carrier types and/or reduce mobility in specific devices as needed, thereby maintaining an acceptable and/or desired performance.

The fins may then be doped as needed. Typically, this may include an ion implantation into the fins so as to form P-well structures and N-well structures. In the CMOS technology of the present invention, P-well structures and N-well structures are formed to allow the integration of NFETs and PFETs in a common substrate. P, As and Sb, for example, are well suited for PFETs. B, In and Ga, for example, are well suited for NFETs. Ion implantation is typically done at a concentration between $1 \times 10^{17}$ $cm^{-3}$ to $5 \times 10^{18}$ $cm^{-3}$ for example. In one embodiment, ion implantation may comprise an angled implant into exposed opposing vertical sidewalls 207 of semiconductor layer 206, and would serve to properly dope the fins.

When a non-SOI wafer embodiment is used, such as just wafer 202 for example, after the fins are etched by time to the desired depth (typically approximately 100 nm–200 nm below wafer 202 surface), a deposit/etch oxide process is used to deposit $SiO_2$ exclusively on the bottom horizontal surfaces of etched wafer 202 of a thickness approximately one-quarter the height of the etched fins. The oxide may be doped with, for example, B in the case of NFETs or P in the case of PFETs, and some portion of the dopant out-diffused into those portions of the fins immediately adjacent to the doped oxide. This serves to suppress leakage in what will be non-gated sidewalls of the fins, from source to drain.

Figure 5A:
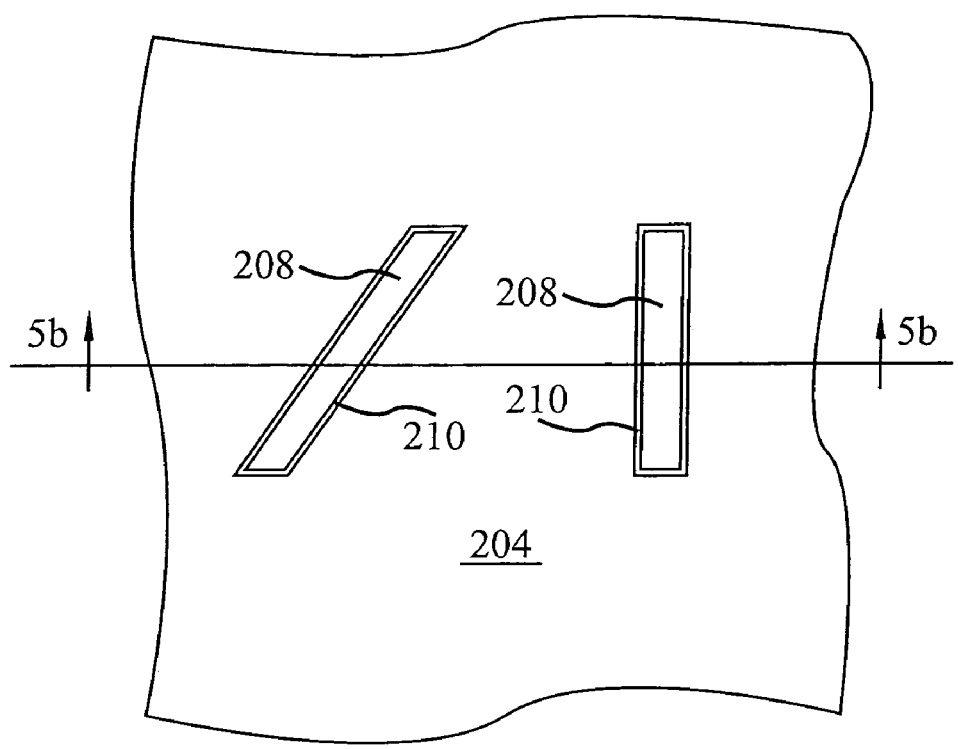
Figure 5B:
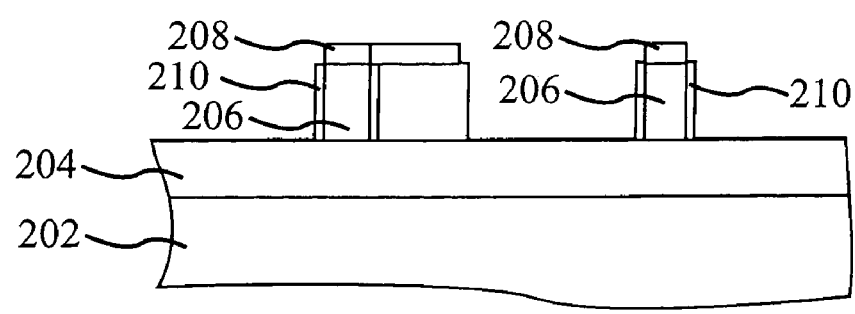

The next steps 106–110 of method 100 form gate stacks. Accordingly, in step 106, gate insulator layers 210 are formed on opposing vertical sidewalls 207 and opposing end walls of the fins (i.e., semiconductor layer 206 portions) as depicted in FIGS. 5a–5b. Gate insulator layers 210 may be formed by thermal oxidation, typically at 750–800° C., or alternatively, may be formed by depositing a dielectric film. For the exemplary purposes of this disclosure, gate insulator layers 210 may be $SiO_2$, a nitrided oxide material, a high-K dielectric material, or combinations thereof, as known in the art.

Figure 6A:
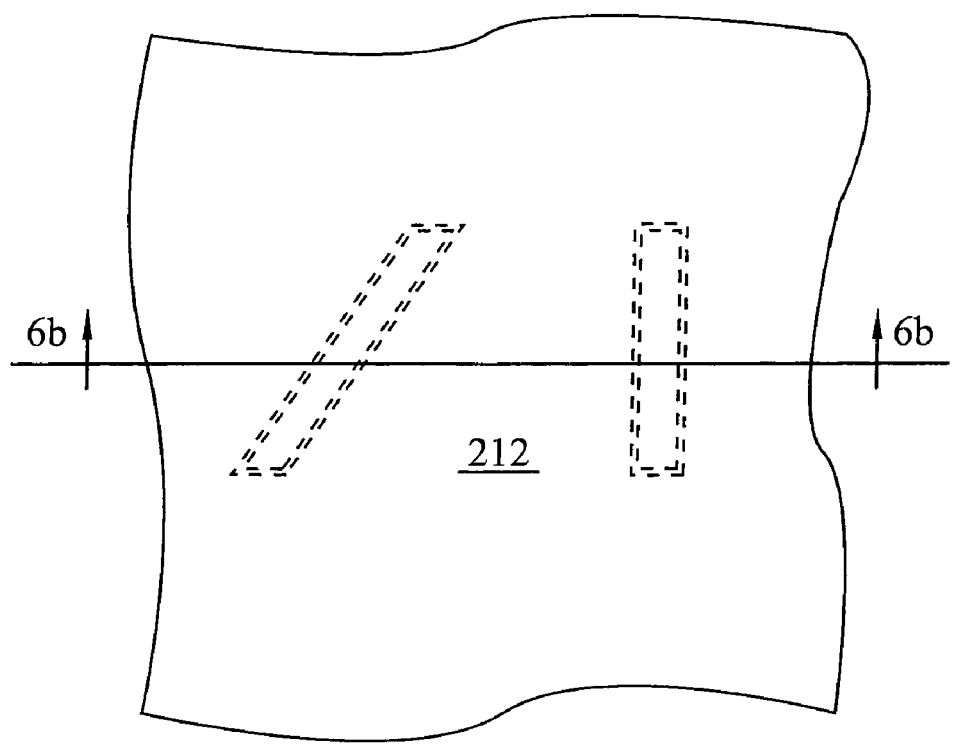
Figure 6B:
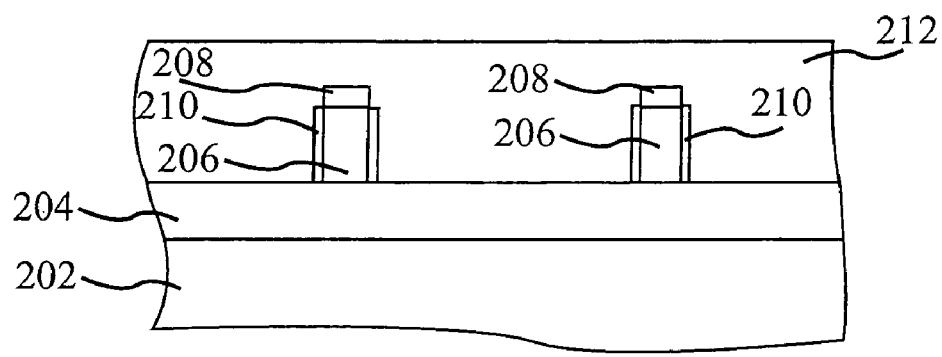

As depicted in FIGS. 6a–6b, step 108 of method 100 is to form gate conductor layer 212 overlying hard mask film 208 narrow lines, oxide layers 210, and buried insulator 204. Gate conductor layer 212 may be any suitable conducting material, typically a polycrystalline silicon material, although amorphous silicon, a combination of amorphous silicon and polysilicon, polysilicon-germanium, or any other appropriate material may be used to form gate conductor layer 212. In addition, in some embodiments of the present invention, it might be advantageous to employ a metal gate conductor layer 212, such as W, Mo, or Ta, or any other refractory metal, or alternatively, a silicided gate conductor comprising polysilicon added with Ni or Co. In step 108, where gate conductor layer 214 encompass a silicon material, such layers may be deposited as a doped layer (in-situ doping). Where gate conductor layer 212 is a metal layer, such layers may be deposited using physical vapor or chemical vapor deposition methods or any other technique known in the art. In this manner, gate structures are formed adjacent to oxide layers 210 formed on opposing vertical sidewalls 207 of the fins formed by semiconductor layer 206 portions.

Figure 7A:
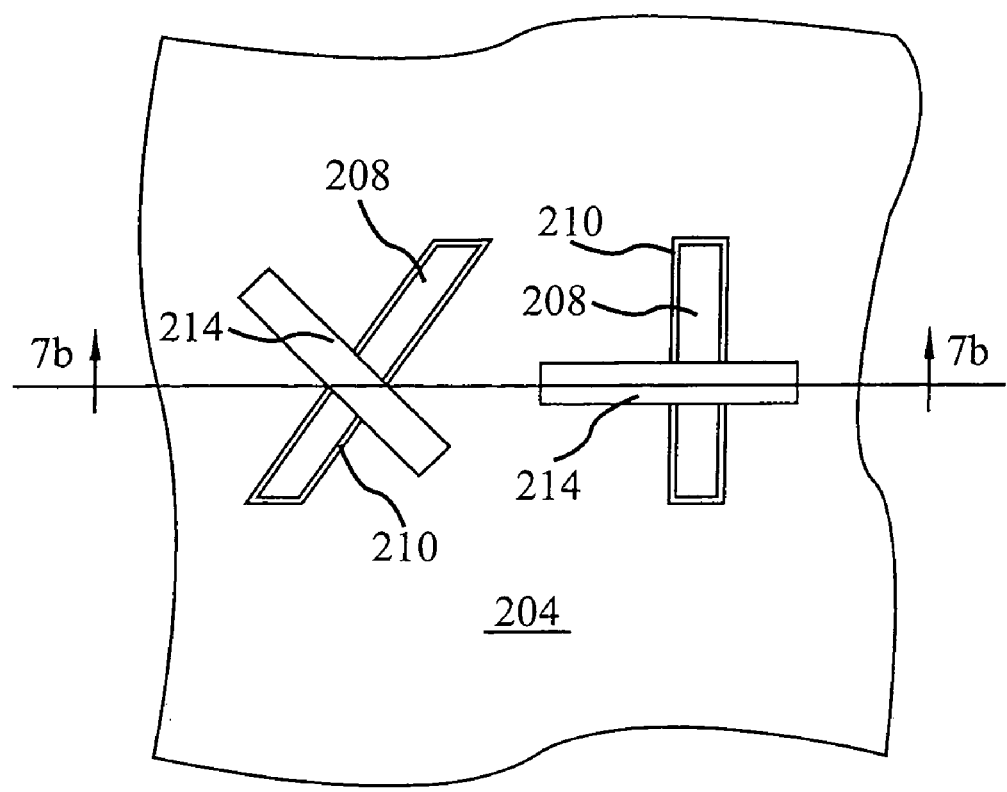
Figure 7B:
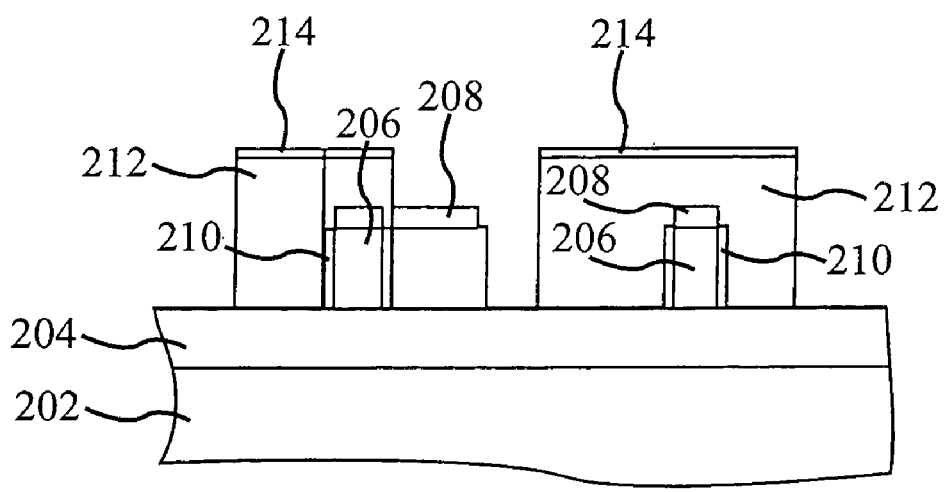

Turning to FIGS. 7a–7b, the next step 110 of method 100 is to pattern gate conductor layer 212. To implement step 110, hard mask film 214 is formed and patterned to facilitate the patterning of gate conductor layer 212. Typically, hard mask film 214 is the same as the already formed hard mask film 208 caps formed on the fins, and therefore may be $SiO_2$ or $Si_3N_4$. Continuing with step 110, next is to pattern gate conductor layer 212. Accordingly, gate conductor layer 212 may be patterned and structured using well known photolithography and etching techniques to form the gate stack, i.e, using hard mask film 214 caps as an etch block during a directional etching of gate conductor layer 212. This involves selectively removing portions of gate conductor layer 212 down to buried insulator 204, but does not remove the portions of semiconductor layer 206 forming the fins that are protected by hard mask film 208 narrow lines. Therefore, the fins may extend beyond the gate stack. The patterning and structuring also leaves portions of gate conductor layer 212, which define the gate structures adjacent the fin bodies.

Thus, in FIGS. 7a–7b, an embodiment of the present invention is depicted having a minimum of complexity. This depicted embodiment of the present invention is at a stage of a process flow technique modified by a fabrication method of the present invention for forming CMOS FinFETs on the same substrate utilizing different crystal planes for FET current channels. Particularly in this embodiment, wafer 202 is depicted with an overlying buried insulator 204. On top of buried insulator 204 are semiconductor layer 206 portions comprising the fins with overlying hard mask film 208 narrow lines. Gate insulator layers 210 are formed on opposing vertical sidewalls 207 and opposing end walls of the fins. As made clear, overlying the fin bodies are gate stacks that comprise: gate insulator layers 210 portions formed on opposing vertical sidewalls 207 portions of the fin bodies; gate conductor layer 212 portions (i.e., gates) overlying gate insulator layers 210 portions and hard mask film 208 narrow line portions overlying the fin bodies; and hard mask film 214 caps overlying gate conductor layer 212 portions.

The FinFET embodiments of FIGS. 7a–7b or any other Fin FET embodiments of the present invention utilizing different crystal planes for FET current channels, may be completed according to step 112 of method 100. Accordingly, exposed portions of the fins may be doped to form S/D regions. The S/D regions may define, in semiconductor layer 206 portions comprising the fin bodies, channel regions underlying the gate stacks. Formation of the S/D regions may be accomplished using any of the variety of methods that have been developed to form S/D regions and that are tailored for specific performance requirements. There are many such methods for forming S/D regions having various levels of complexity. Thus, in some embodiments of the present invention, using ion implantation for example, lightly doped S/D regions or other S/D regions may be formed. Thus, for NFETs, typically P, As, or Sb for example is used for the S/D implants in the range of 1 to 5 keV and a dose of $5\times10^{14}$ to $2\times10^{15}$ cm$^{-3}$. Similarly, for PFETs, typically B, In, or Ga for example is used for the S/D implants in the range of 0.5 to 3 keV and dose of $5\times10^{14}$ to $2\times10^{15}$ cm$^{-3}$.

Optionally, extension and halo implants may be formed that improve Short Channel Effects (SCE). For NFETs, typically B, In, or Ga may be used for the halo implants with energies in the range of 5 to 15 keV and a dose of $1\times10^{13}$ to $8\times10^{13}$ cm$^{-3}$. Similarly, for PFETs, P, As, or Sb may be used for the halos, with energies from 20 to 45 keV and dose of $1\times10^{13}$ to $8\times10^{13}$ cm$^{-3}$.

Continuing with step 112, contacts to sources, drains, and gates may then be formed. Accordingly, an inter metal dielectric may be deposited and planarized typically using a CMP process. Contact holes may then be structured and etched using an anisotropic process (e.g. RIE) or the like. The contact holes may be filled using any conducting material, such as doped polysilicon, silicide (e.g. WSi), metals (e.g. Au, Al, Mo, W, Ta, Ti, Cu, or ITO (indium-tin oxide)), or the like, being deposited by evaporation, sputtering, or other known techniques, thereby forming S/D contacts. Then the first metal layer may be deposited and structured using a RIE process or the like. Alternatively, the structuring of the first metal layer may be done following a damascene process flow.

Figure 8:
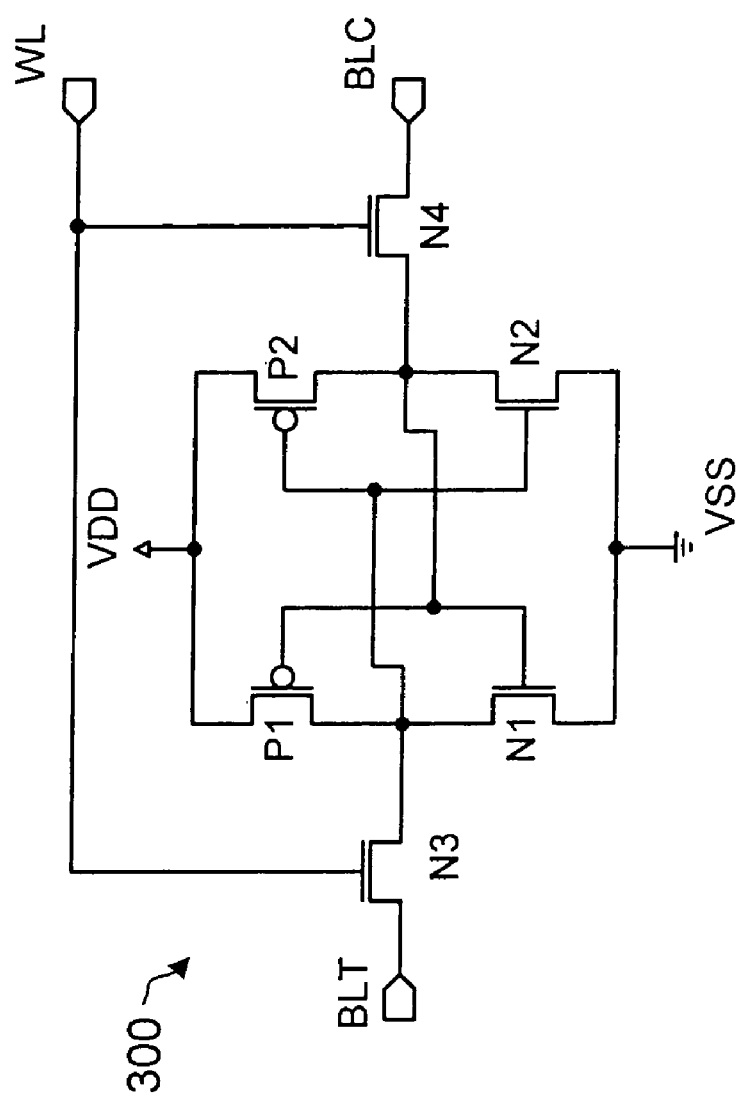
FIG. 8. is a schematic representation of an SRAM memory cell.

Describing the use of the inventive CMOS FinFETs further by way of a particular example, one of the most important CMOS devices is the SRAM cell used in many demanding memory application. Turning now to FIG. 8, a suitable SRAM cell 300 is illustrated schematically. SRAM cell 300 is a typical in that it uses four transistors to form a storage latch, and two transistors are used as transfer devices. In particular, PFETs P1 and P2, and NFETs N1 and N2 form a storage latch used to store data in the SRAM cell. NFETs N3 and N4 serve as transfer devices to get data to and from the storage latch.

In SRAM cell design, one important parameter is the relative gain of the transfer NFETs. In particular, if the transfer NFETs are too weak, they cannot reliable write to the storage latch. In the transfer NFETs are too strong, they can be inadvertently flipped by the internal capacitances of the bit lines. Thus, the relative gain of the transfer NFETs must be carefully determined. Common design parameters call for the gain of the transfer NFETs to be approximately half that of the NFETs in the storage latch.

In prior implementations, the differential between the gain of the transfer NFETs has been accomplished by changing the relative dimensions of the devices. For example, the width of devices has been increased to increase the strength of a particular device. Thus, the width of the storage latch NFETs has been increased to increase the gain of those transistors relative to the transfer NFETs. As another method, the gate length of the transfer NFETs has been increased, thus reducing the relative gain of those NFETs. Unfortunately, both these techniques increase the size of the strengthened FET device and thus negatively effect the device density that can be achieved.

In accordance with the present invention, NFETs with different gains will be formed without requiring excessive device size. In particular, the transfer n-type FinFETs will be formed in a low carrier mobility plane and thus have a relatively low gain. Conversely, the storage latch n-type FinFETs are formed in a high carrier mobility plane and thus have a relatively high gain.

Specifically, the body of the transfer n-type FinFETs are formed with a sidewall in the {110} plane while the body of the storage latch n-type FinFETs are formed with a sidewall in the {100} crystal plane. The mobility of electrons (the dominate carrier of n-type devices) in the {110} plane is approximately half that of the mobility of electrons in the {100} plane. Thus, the transfer n-type FinFETs formed with their body in a {110} plane will have approximately half the gain of the storage latch n-type FinFETs formed with their body in a {100} plane. Thus formed, the transfer devices will have a gain approximately half that of the n-type storage latch devices, facilitating proper SRAM operation.

Turning now to FIGS. 9–14, the formation of an SRAM cell using the principles of the present invention and method 100 is illustrated. These figures illustrate a single SRAM cell, but those skilled in the art will recognize that a typically device will include large numbers of these cells, typically tiled left and right and mirrored top and bottom along the cell boundary lines to create an SRAM array.

The SRAM cell is formed using FinFETs. In FinFETs, the body is formed in "fin" shape with the gate formed on one or both sides of the fin. The preferred method for forming the FinFETs uses sidewall image transfer to define the fin bodies of the transistors. This allows the gate length of the device to have minimum feature size, while allowing the thickness of the body to be much smaller than the gate length. Specifically, the body thickness is determined by the image of a sidewall spacer, allowing the body to be reliably formed at sub minimum feature size.

The SRAM cell is preferably formed on a silicon on insulator (SOI) wafer. As such, the wafer comprises a buried oxide layer beneath an SOI layer. As will be come clear, the SOI layer is used to form the body of the double gated transistor. As such, it is generally preferable to use a SOI layer that has a p-type (for NFETs) doping density in the range of $3\times10^{18}$ cm$^{-3}$ to $8\times10^{18}$ cm$^{-3}$ to provide proper centering and control of the threshold voltage of the transistor.

With a SOI wafer provided, the fin structure is patterned into the SOI layer using sidewall image transfer. This typically involves the formation of a mandrel layer and at least one etch stop layers. The mandrel layer is then patterned, and sidewall spacers are formed on the sidewalls of the patterned mandrel layer. The SOI layer is then etched selective to the sidewall spacers, and thus the fin bodies are defined using sidewall image transfer.

Figure 9:
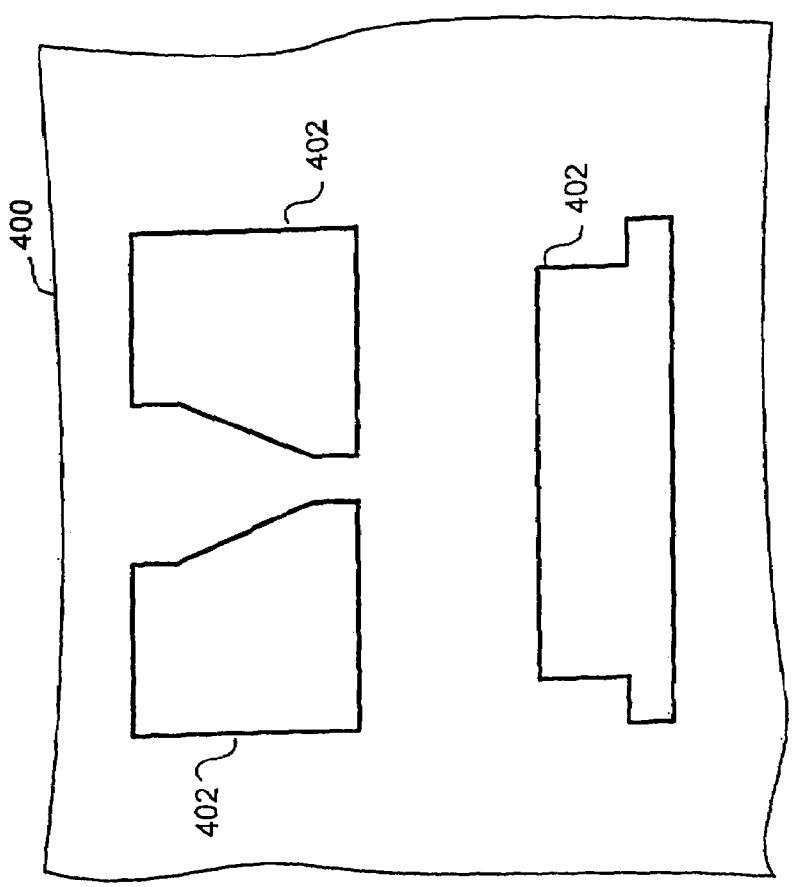
FIGS. 9–14 are top views of an SRAM memory cell during fabrication.

Turning now to FIG. 9, a wafer portion 400 is illustrated after the patterning of the SOI layer to form a fin structure. Specifically, FIG. 9 illustrates the formation of fin rings 402 in the SOI layer. Gate dielectric is then formed on the sidewalls of the fin rings 402. The gate oxide is preferably formed by thermal oxidation, typically at 750–800° C. Also, during this step an implantation into the body of the transistor can be done. This would preferably comprise an angled implant into the exposed sidewall of the SOI layer, done before the formation of the gate oxide. This would serve to properly dope the body of the transistor.

It should be noted that in the device illustrated in FIG. 9, the top two fin rings 402 will be used to form four n-type FETs, while the bottom ring 402 will be used to form two p-type FETs. It should also be noted that the two upper rings are formed with the "diagonal" portion. The sidewalls of these diagonal portions are formed on the {110} plane of the wafer. Thus, the sidewalls of the fins are in the low mobility plane for n-type devices. As will become clear, two low-gain n-type FinFETs will be formed at these diagonal portions. The horizontal and vertical portions of the fin rings have sidewalls formed in the {100} plane, and thus will be used to form the high gain n-type FinFETs.

Figure 10:
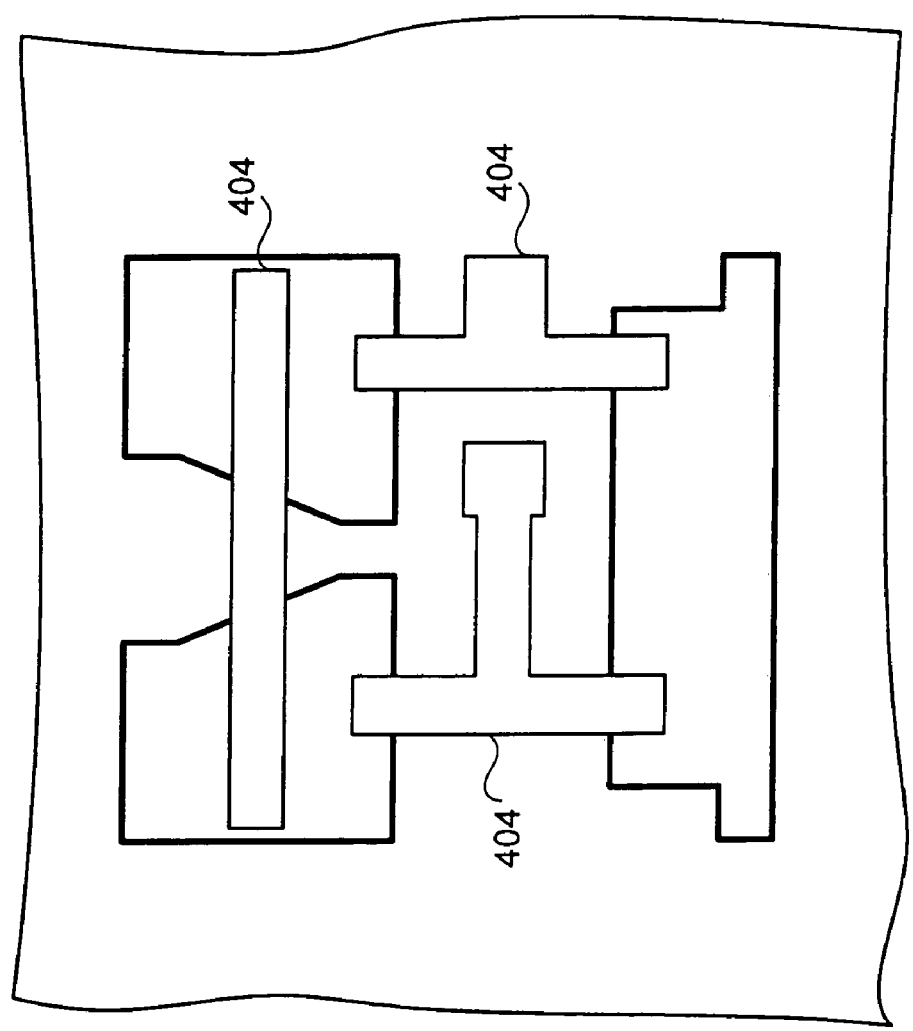

Turning now to FIG. 10, the next step is to form gate structures 404 over selected portions of the fin rings. This forms FinFETs where gate structures cross over the previously created fin bodies. This process is typically done by depositing and patterning polysilicon. Where the patterned polysilicon crosses the fin ring 402 a transistor will be formed. In accordance with the present invention, the patterned polysilicon 404 crosses the lower fin ring twice, forming the two p-type devices found in the SRAM cell. Likewise, the patterned polysilicon 404 crosses the two upper fin rings four times, forming the four n-type devices in the SRAM cell.

Two of the n-type devices are formed where the polysilicon 404 crosses the upper fin rings at diagonal portions of the rings, and two of the n-type devices are formed where the polysilicon 404 crosses the upper fin rings at a horizontal portions of the rings. The two n-type devices formed at the diagonal portions have body sidewalls in {110} plane. Again, this is a low mobility plane for n-type devices, and these two devices thus have relatively low gain. The two n-type devices formed at the horizontal portions have body sidewalls in the {100}. Again, this is a relatively high mobility plane for n-type devices, and these two devices thus have relatively high gain.

Figure 11:
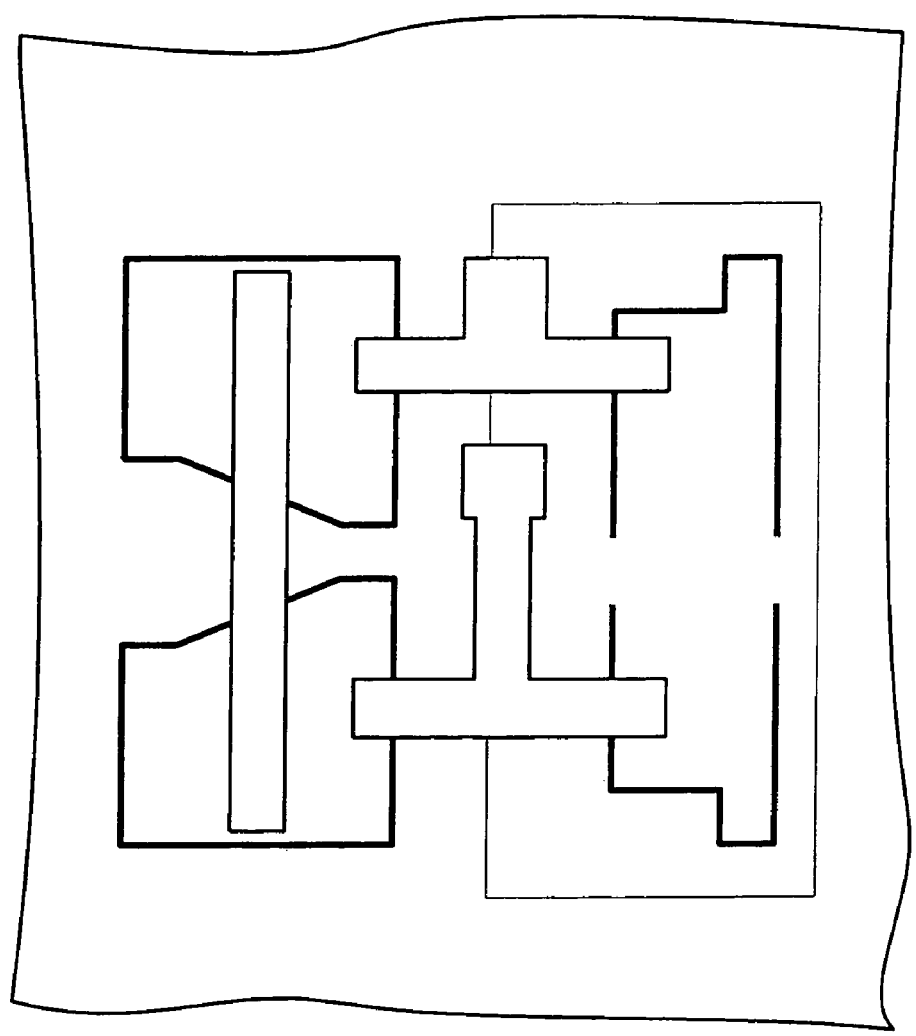

Turning now to FIG. 11, the next step is to dope the polysilicon gates and form the source/drain implants. Typically, the n-type devices are implanted with suitable dopants and then the p-type devices are implanted with suitable dopants. In some cases, it may be desirable to form wells at this time as well. Additionally, the lower fin ring is trimmed to separate the two p-type devices. Spacers and silicide can then be formed as needed.

Figure 12:
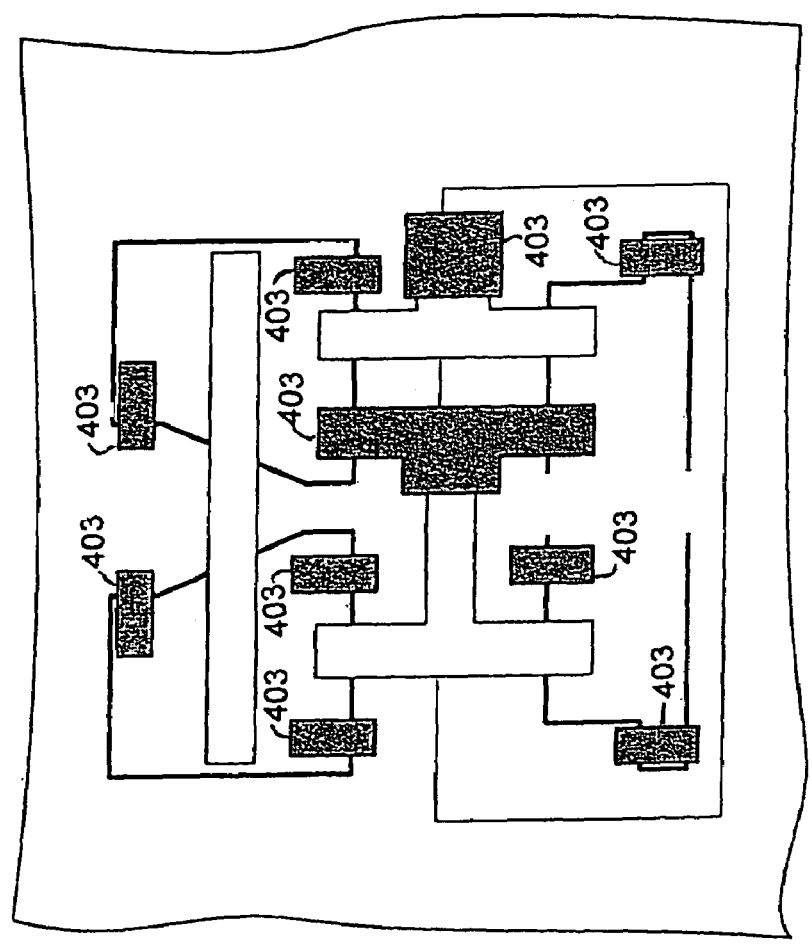

Turning now to FIG. 12, the next step is to form the contacts for the devices. These are typically formed with a local interconnect metal layer, such as with damascene applied tungsten, but they can be formed from any suitable conductive material and process. FIG. 12 illustrates the formation of ten of these contacts in the SRAM cell. One of these contacts 403 also connects one n-type device with one p-type device to partially connect the storage latch.

Figure 13:
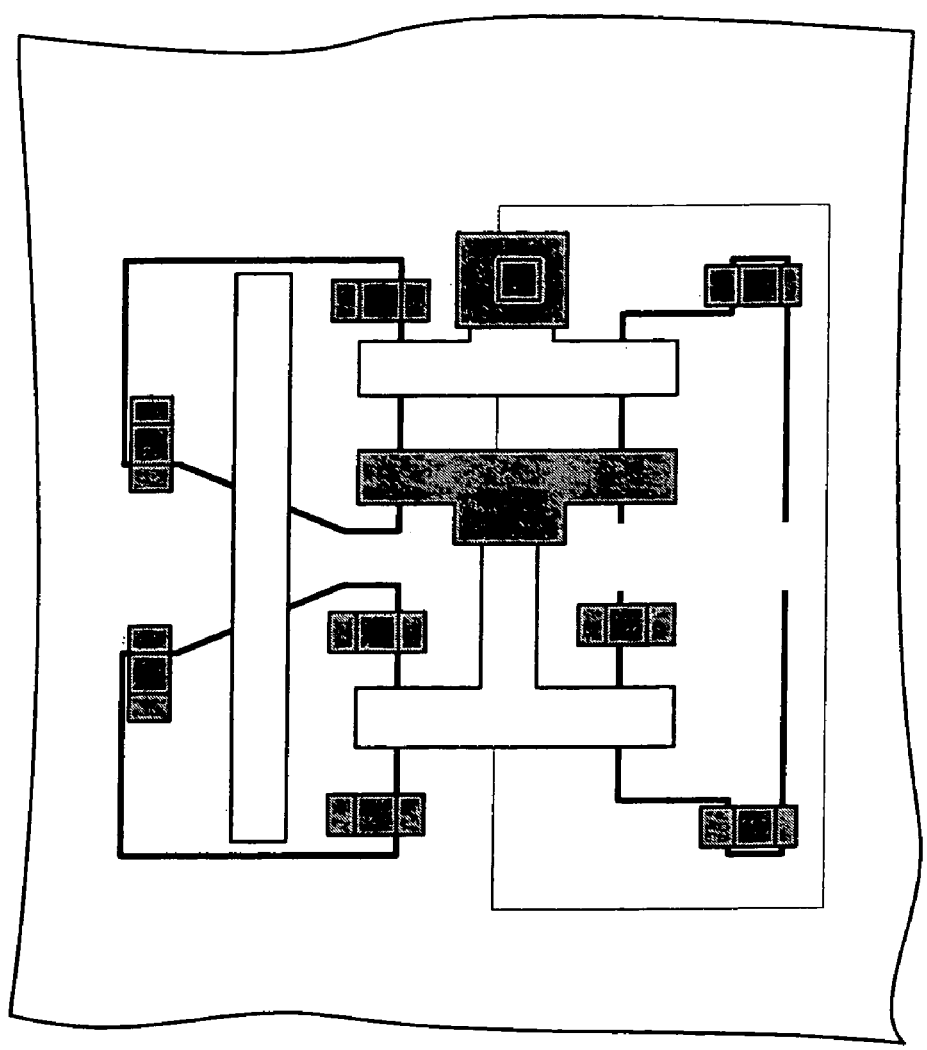

Turning now to FIG. 13, the next step is to form vertical interconnect studs to connect the previously formed contacts with the next wiring layer. FIG. 13 illustrates the formation of nine of these vertical interconnect studs.

Figure 14:
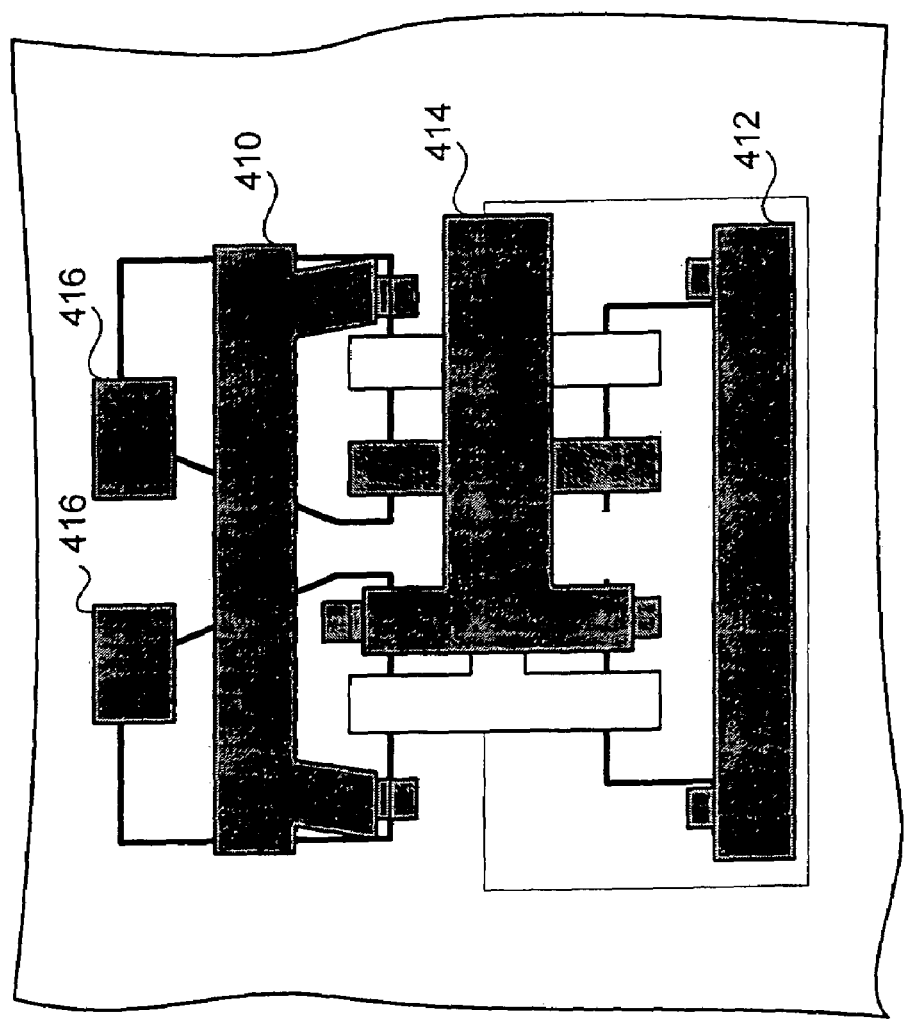

Turning now to FIG. 14, the next step is to form the first wiring layer. This wiring layer includes the ground connection line 410 and a VDD connection line 412. The first wiring layer also connects the devices in the storage latch with connection line 414. Finally, the first wiring layer is additionally used to form contacts 416 that will be used to connect the transfer n-type FinFETs to the bit lines that will be formed in later wiring layers. The additionally back end of line processing can then be completed.

Thus, a SRAM device is formed in which the relative gain of the transfer NFETs is properly reduced when compared to the gain of the NFETs in the storage latch. Again, this is accomplished without requiring excessive device size. In particular, the transfer n-type FinFETs will be formed in a low carrier mobility plane and thus have a relatively low gain. Conversely, the storage latch n-type FinFETs are formed in a high carrier mobility plane and thus have a relatively high gain.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. For example, The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

The invention claimed is:

1. A method of forming a semiconductor device, the method comprising the steps of:
    forming a patterned hard mask on a semiconductor substrate, wherein a first portion of the hard mask is oriented in a first direction, and wherein a second portion of the hard mask is oriented in a second direction that differs from the first direction;
    anisotropically etching the substrate, using the hard mask as an etching mask, to form a fin body, wherein the fin body has a first portion with a sidewall oriented in the first direction and oriented on a first plane that provides a first carrier mobility, and wherein the fin body has a second portion with a sidewall oriented in the second direction and oriented on a second plane that provides a second carrier mobility, wherein the second carrier mobility differs from the first carrier mobility;
    forming a transfer transistor at the first portion of the fin body; and
    forming a latch transistor at the second portion of the fin body, wherein the transfer transistor comprises an n-channel transistor and wherein the latch transistor comprises an n-channel transistor, wherein the transfer transistor and the storage transistor are formed as part of a memory cell, and wherein the transfer transistor is coupled to pass data to the storage transistor.

2. The method of claim 1, further comprising selecting the first and second directions such that the first carrier mobility is loss than the second carrier mobility.

3. The method of claim 2, wherein the transfer transistor has a gain, and the latch transistor has a gain, and wherein the transfer transistor gain is less than the latch transistor gain due to the first carrier mobility being less than the second carrier mobility.

4. The method of claim 1, further comprising selecting the first and second directions such that the first plane comprises a {110} plane and the second plane comprises a {100} plane.

5. The method of claim 1, wherein the memory cell comprises an SRAM memory cell.

6. A method of forming a memory cell comprising;
    forming a patterned hard mask on a semiconductor substrate, wherein a first portion of the hard mask is oriented in a first direction, and wherein a second portion of the hard mask is oriented in a second direction that differs from the first direction;
    anisotropically etching the substrate, using the hard mask as an etching mask, to form a first fin body and a second fin body, wherein the first fin body comprises a first sidewall oriented in the first direction and oriented on a first plane that provides a first carrier mobility, and wherein the second fin body comprises a second sidewall oriented in the second direction and oriented on a second plane that provides a second carrier mobility, wherein the second carrier mobility differs from the first carrier mobility;
    providing a first transfer transistor that includes the first fin body having the first sidewall;
    providing a second transfer transistor that includes the second fin body having the second sidewall; and
    coupling a storage latch to the first and second transfer transistors to receive data from the first and second transfer transistors, wherein the storage latch comprises first and second storage latch transistors, and wherein the first storage latch transistor includes a third fin body having a third sidewall and wherein the second storage latch transistor has a fourth body having a fourth sidewall.

7. The method of claim 6, wherein the third sidewall is oriented on a third crystal plane, and wherein the fourth sidewall is oriented on a fourth crystal plane, and wherein the first, second, third and fourth crystal planes are selected to provide a greater carrier mobility in the first and second storage latch transistors than the carrier mobility in the first and second transfer transistors.

8. The method of claim 7, wherein the first transfer transistor comprises a n-channel transistor and wherein the first plane comprises a {110} plane and wherein the first storage latch transistor comprises an n-channel transistor and wherein the third plane comprises a {100} plane.

9. The method of claim 6, wherein the first transfer transistor, the second transfer transistor, the first storage latch transistor, and the second storage latch transistor each comprise an n-channel transistor.

10. The method of claim 9, wherein the storage latch further comprises a first p-channel transistor and a second p-channel transistor.

11. A method of forming a semiconductor structure comprising:
    forming a patterned hard mask on a semiconductor substrate, wherein a first portion of the hard mask is oriented in a first direction, and wherein a second portion of the hard mask is oriented in a second direction that differs from the first direction;
    anisotropically etching the substrate, using the hard mask as an etching mask, to form a fin body, wherein the fin body has a first portion with a sidewall oriented in the first direction and oriented on a first plane that provides a first carrier mobility, and wherein the fin body has a second portion with a sidewall oriented in the second direction and oriented on a second plane that provides a second carrier mobility, wherein the second carrier mobility differs from the first carrier mobility;
    providing a first transfer transistor at the first portion of the fin body;
    providing a latch transistor at the second portion of the fin body; and
    providing a second transfer transistor, wherein the latch transistor is disposed between and coupled to the first transfer transistor and the second transfer transistor.

12. The method of claim 11, wherein the first transfer transistor, the second transfer transistor, and the latch transistor each comprise an n-channel transistor.

13. The method of claim 11, farther comprising selecting the first and second directions such that the first carrier mobility is less than the second carrier mobility.

14. The method of claim 13, wherein the first transfer transistor has a gain, wherein the latch transistor has a gain, and wherein the first transfer transistor gain is less than the latch transistor gain due to the first carrier mobility being less than the second carrier mobility.

15. The method of claim 13, wherein the first transfer transistor comprises a portion of a memory cell.

16. The method of claim 15, wherein the memory cell comprises an SRAM memory cell.

17. The method of claim 11, further comprising selecting the first and second directions such that the first plane comprises a {110} plane and the second plane comprises a {100} plane.

18. The method of claim 11, wherein the first transfer transistor and the storage transistor are a part of a memory cell, and wherein the first transfer transistor is coupled to pass data to the storage transistor.

* * * * *

UNITED STATES PATENT AND TRADEMARK OFFICE
CERTIFICATE OF CORRECTION

PATENT NO. : 7,087,477 B2  Page 1 of 1
APPLICATION NO. : 10/987532
DATED : August 8, 2006
INVENTOR(S) : Fried et al.

It is certified that error appears in the above-identified patent and that said Letters Patent is hereby corrected as shown below:

Column 13
Line 4, delete "farther" and insert -- further --

Signed and Sealed this

Fourteenth Day of November, 2006

JON W. DUDAS
*Director of the United States Patent and Trademark Office*